United States Patent
Oshimo et al.

(10) Patent No.: US 6,245,483 B1
(45) Date of Patent: *Jun. 12, 2001

(54) PHOTOSENSITIVE RESIN COMPOSITION

(75) Inventors: Chihiro Oshimo; Tohru Wada; Masahiko Nakamori, all of Otsu (JP)

(73) Assignee: Toyo Boseki Kabushiki Kaisha, Osaka-fu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 10 days.

(21) Appl. No.: 09/088,505

(22) Filed: Jun. 1, 1998

(30) Foreign Application Priority Data

Jun. 9, 1997 (JP) .................................. 9151231

(51) Int. Cl.[7] ................................... G03F 7/027
(52) U.S. Cl. ................. 430/281.1; 430/138; 428/402.24
(58) Field of Search ............................... 430/138, 281.1, 430/300; 428/402.24

(56) References Cited

U.S. PATENT DOCUMENTS

| | | | |
|---|---|---|---|
| 4,956,252 | * 9/1990 | Fryd et al. | 430/138 |
| 5,075,192 | 12/1991 | Fryd et al. | 430/138 |
| 5,346,954 | 9/1994 | Wu et al. | 525/85 |
| 5,547,999 | 8/1996 | Satake et al. | 522/122 |
| 5,622,813 | * 4/1997 | Kanda et al. | 430/281.1 |
| 5,707,773 | * 1/1998 | Grossman et al. | 430/138 |

FOREIGN PATENT DOCUMENTS 0 640 876 A1  3/1995 (EP) .
0 755 946 A2  1/1997 (EP) .

OTHER PUBLICATIONS

Derwent Publications Ltd., London, GB; AN 93–088701, XP002108792 and JP 05 032743 A (Toyo Ink MFG CO.), Abstract only.
Patent Abstracts of Japan, vol. 98, No. 10, Aug. 31, 1998, and JP 10 123710 A (Toyobo Co., Ltd.), May 15, 1998, Abstract only.
Patent Abstracts of Japan, vol. 98, No. 11, Sep. 30, 1998, and JP 10 148930 A (Toyobo Co., Ltd.), Jun. 2, 1998, Abstract only.

* cited by examiner

Primary Examiner—Janet Baxter
Assistant Examiner—Rosemary Ashton
(74) Attorney, Agent, or Firm—Morrison & Foerster LLP

(57) ABSTRACT

A photosensitive resin composition for flexographic printing comprising dispersed particles of (1) a core phase mainly composed of a non-crosslinkable hydrophobic polymer (A) having a glass transition temperature at 5° C. or lower, and (2) a shell phase covering the core phase which is mainly composed of a hydrophilic polymer; and (3) a matrix phase mainly composed of a mixture of a hydrophobic polymer (B) which is immiscible with the hydrophobic polymer (A) and a non gaseous ethylenic unsaturated compound. The difference between refractive index of said hydrophobic polymer (A) of the core phase (1) and that of the mixture of said hydrophobic polymer (B) and said ethylenic unsaturated compound of the matrix phase (3) is 0.010 or less, thereby decreasing light scattering in the resin. The photosensitive resin composition can be developed with an aqueous developer and has wide light exposure latitude, improved printing reproducibility and improved aqueous ink resistance.

20 Claims, No Drawings

PHOTOSENSITIVE RESIN COMPOSITION

FIELD OF THE INVENTION

The present invention relates to a photosensitive resin composition which can be developed with an aqueous developer and is useful for flexographic printing. In particular, the present invention relates to a photosensitive resin composition for flexographic printing which have a wide proper range of light exposure time (light exposure latitude) and improved printing reproducibility.

BACKGROUND OF THE INVENTION

As photosensitive resin original sheets for flexographic printing, those to be developed by organic solvents had been known. However, in such conventional photosensitive resin original sheets had safety problems for a human body and the environment such as toxicity, flammability and the like.

Then, photosensitive resin compositions for photosensitive resin original sheets which can be developed with an aqueous developer have been proposed as a substitute for such conventional photosensitive resin original sheets. For example, JP-A 63-8648 discloses a photosensitive resin composition in which hard and finely divided organic particles are included to improve properties of the resultant printing matrix such as mechanical strength, impact resilience and the like. JP-A 2-175702, JP-A 3-228060, JP-A 4-293907, JP-A 4-293909, JP-A 4-294353, JP-A 4-340968, JP-A 5-32743, JP-A 5-150451 and JP-A 5-204139 disclose photosensitive resin compositions in which finely divided crosslinkable resin particles are included to provide developability with an aqueous developer and aqueous ink resistance and to improve printability. JP-A 59-36731 discloses a photosensitive resin composition in which ink receptivity of the resultant printing matrix is improved by providing two-phase structure to the composition, whose continuous phase contains a diazo compound and a bichromate and whose dispersed phase contains particles having a particle size of 10 μm or less.

However, since such a photosensitive resin composition has multiple phase structure, irradiated actuating light does not go straight through the composition, but it is refracted at the interfaces between phases and scattered in the resin. When such a photosensitive resin composition is used as an original printing sheet, the imaged part of a relief obtained by developing is thicker than its original image on a negative film, or the depth of a non-imaged part is smaller due to light scattering upon light exposure for imaging. Then, when printing is carried out by using such a relief, it is likely that the image of the resultant printed matter is thicker than that of the original image, dot parts darken (dot gain), and printing quality is deteriorated because too much ink is adhered to a non-imaged part. Since these tend to be accelerated by excess light exposure, attention should be given to avoid excess light exposure. However, for reproducing a minute or fine image as a relief after developing, sufficient light exposure is required. That is, the range of proper light exposure time (light exposure latitude) of a photosensitive resin printing original sheet having multiple phase structure is apt to be narrower.

OBJECT OF THE INVENTION

The present invention is directed to solution of the above-described problems of photosensitive resin compositions and the main object of the present invention is to inhibit light scattering in a photosensitive resin composition.

Thus, one object of the present invention is to provide a photosensitive resin composition for flexographic printing having wide light exposure latitude and improved printing reproducibility, as well as having developability with an aqueous developer and improved aqueous ink resistance.

This object as well as other objects and advantages of the present invention will become apparent to those skilled in the art from the following description.

SUMMARY OF THE INVENTION

In JP-A 3-72353, JP-A 3-171139 and JP-A 7-168358, the resent inventors have proposed a photosensitive resin printing original sheet having improved printability obtained by controlling phase structure of hydrophobic and hydrophilic phases of the photosensitive resin layer in the photosensitive resin printing original sheet and adjusting an average particle diameter of the dispersed phase in the photosensitive resin layer to 0.001 to 10 μm. According to the present invention, a photosensitive resin composition having improved printing reproducibility can be obtained by adjusting the difference in refractive indexes of the core phase and the matrix phase of the photosensitive resin composition to 0.010 or less to inhibit light scattering in the composition.

That is, according to the present invention, there is provided a photosensitive resin composition which comprises:

(1) a core phase mainly composed of a non-crosslinkable hydrophobic polymer (A) having a glass transition temperature at 5° C. or lower;

(2) a shell phase mainly composed of a hydrophilic polymer;

(3) a matrix phase mainly composed of a mixture of a hydrophobic polymer (B) which is immiscible with the hydrophobic polymer (A) and a non-gaseous ethylenic unsaturated compound; and (4) a photopolymerization initiator, and the difference between refractive index of said hydrophobic polymer (A) of said core phase (1) and that of said mixture of said hydrophobic polymer (B) and said non-gaseous ethylenic unsaturated compound of said matrix phase (3) being 0.010 or less.

In addition, in the present invention, it is of importance to control miscibility between the compounding components one another to maintain the above-described phase-separated structure.

Although it has been known to improve transparency of a material having multiple phase structure by reducing the difference in refractive indexes of phases to inhibit light scattering in optical materials such as lenses, such technique has not been known heretofore in the art of photosensitive resin compositions.

DETAILED DESCRIPTION OF THE INVENTION

The photosensitive resin composition of the present invention has phase-separated structure comprising dispersed particles composed of a core phase, i.e., the nuclei of the particles, and a shell phase which covers about the core phase, and a matrix phase which surrounds the dispersed particles.

The core phase of the composition of the present invention is mainly composed of a non-crosslinkable hydrophobic polymer (A) having a glass transition temperature of 5° C. or lower. The term "hydrophobic" used herein means such properties that the polymer is not soluble in and is not swollen with water or a developer mainly composed of water. The difference between the refractive index of the hydrophobic polymer (A) and that of a mixture of the hydrophobic polymer (B) and the non-gaseous ethylenic unsaturated compound which is the main component of the matrix phase as described hereinafter is 0.010 or less.

The hydrophobic polymer (A) has a glass transition temperature of 5° C. or lower and includes a polymer to be used as a general-purpose elastomer. When a glass transition temperature of the hydrophobic polymer (A) is higher than 5° C., rubber resilience of the resultant photosensitive resin printing matrix is remarkably lowered to adversely influence on its printability. This is undesired.

Examples of the hydrophobic polymer (A) include isoprene rubber, butadiene rubber, 1,2-polybutadiene, styrene-butadiene rubber, chloroprene rubber, nitrile-butadiene rubber, styrene-butadiene-styrene block copolymer, styrene-isoprene-styrene block copolymer, butyl rubber, ethylene-propylene rubber, chlorosulfonated polyethylene, butadiene-(meth)acrylate copolymer, acrylonitrile-(meth)acrylate copolymer, epichlorohydrin rubber, chlorinated polyethylene, silicone rubber and urethane rubber, among others. In particular, nitrile-butadiene rubber and chlorinated polyethylene are preferred.

The term "(meth)acrylate" used herein includes both acrylate and methacrylate. Likewise, term "(meth)acrylic acid" used herein includes both acrylic acid and methacrylic acid.

The hydrophobic polymer (A) is compounded in an amount of 10 to 60%, preferably 20 to 50% by weight based on the total weight of the resin composition. When the amount of the hydrophobic polymer (A) compounded in the composition is less than 10% by weight, shape retention of the resultant photosensitive resin printing original sheet and rubber resilience of the resultant printing matrix are lowered. On the other hand, when the amount exceeds 60% by weight, developability with an aqueous developer is lowered. Therefore, the above range of the amount of the hydrophobic polymer (A) in the composition is preferred.

The shell phase in the present invention is mainly composed of the hydrophilic polymer. The term "hydrophilic" used herein means that the polymer is soluble in or is swollen with water or an aqueous developer mainly composed of water.

The hydrophilic polymer used in the present invention is that a polymer having a hydrophilic group such as —COOH, —COOM, —OH, —NH$_2$, —SO$_3$H or the like. Examples thereof include polymer of (meth)acrylic acid or its salt, copolymer of (meth)acrylic acid or its salt and alkyl (meth) acrylate, copolymer of (meth)acrylic acid or its salt and styrene, copolymer of (meth) acrylic acid or its salt and vinyl acetate, copolymer of (meth) acrylic acid or its salt and acrylonitrile, polyvinyl alcohol, carboxymethylcellulose, polyacrylamide, hydroxyethyl cellulose, polyethylene oxide, polyethylene imine, polyurethane having —COOM group, polyureaurethane having —COOM group, polyester having —COOM group, epoxy compound having —COOM group, polyamide acid having —COOM group, and their salts and derivatives. The hydrophilic polymer can be used alone or in combination of two or more of them. If necessary, the hydrophilic polymer may be modified so as to react with the non-gaseous ethylenic unsaturated compound described hereinafter.

The above symbol "M" represents monovalent metal ion (e.g., Li$^+$, Na$^+$, K$^+$, Rb$^+$, Cs$^+$, Fr$^+$, etc.), divalent metal ion (e.g., Ca$^{2+}$, Mg$^{2+}$, Sr$^{2+}$, Ba$^{2+}$, Zn$^{2+}$, Cu$^{2+}$, Ra$^{2+}$, etc.), trivalent metal ion (e.g., Al$^{3+}$, Fe$^{3+}$, etc.), or substituted or unsubstituted ammonium ion. In the above hydrophilic polymer having —COOM group, the amount of —COOM group is within 50 to 50,000 equivalent/g from the viewpoint of compatibility of developability with water and aqueous ink resistance. The hydrophilic polymer having —COOM group may be prepared by first producing the corresponding polymer having —COOH group and then neutralizing it with an alkali (e.g., hydroxide, carbonate, acetate, alkoxide, etc.) or amine compound having the ion "M".

The hydrophilic polymer is compounded in an amount of 1 to 50%, preferably 5 to 30% by weight based on the total weight of the resin composition. When the amount of the hydrophilic polymer compounded is less than 1% by weight, developability of the resultant photosensitive resin original sheet with an aqueous developer is lowered. On the other hand, when the amount exceeds 50% by weight, aqueous ink resistance of the resultant photosensitive resin printing matrix is lowered. Therefore, the above range of the amount of the hydrophilic polymer in the composition is preferred.

The matrix phase in the present invention is mainly composed of a mixture of the hydrophobic polymer (B) which is immiscible with the hydrophobic polymer (A) and a non-gaseous ethylenic unsaturated compound. The difference between the refractive index of this mixture and that of the hydrophobic polymer (A) which is the main component of the above core phase is 0.010 or less. The refractive index of this mixture can be adjusted by appropriately selecting the combination of the hydrophobic polymer (B) and the non-gaseous ethylenic unsaturated compound described hereinafter and the mixing ratio thereof.

Examples of the hydrophobic polymer (B) include isoprene rubber, butadiene rubber, 1,2-polybutadiene, styrene-butadiene rubber, chloroprene rubber, nitrile-butadiene rubber, styrene-butadiene-styrene block copolymer, styrene-isoprene-styrene block copolymer, butyl rubber, ethylene-propylene rubber, chlorosulfonated polyethylene, butadiene-(meth)acrylate copolymer, acrylonitrile-(meth)acrylate copolymer, epichlorohydrin rubber, chlorinated polyethylene, silicone rubber, and urethane rubber, among others. In particular, isoprene rubber and butadiene rubber are preferred.

In the present invention, in order to keep the hydrophobic polymer (B) immiscible with the hydrophobic polymer (A), to use polymers having different solubility parameters (SP values) is preferred. In particular, it is preferred to use a polymer having SP value within the range from 8.8 to 9.8 as the hydrophobic polymer (A), and a polymer having SP value within range from 7.8 to <8.8 as the hydrophobic polymer (B).

The hydrophobic polymer (B) is compounded in an amount of 1 to 24%, preferably 5 to 20% by weight based on the total weight of the resin composition. When the amount of the hydrophobic polymer (B) compounded is less than 1% by weight, shape retention of the resultant photosensitive resin original sheet and rubber resilience of the resultant printing matrix are lowered. On the other hand, when the amount of the hydrophobic polymer (B) exceeds 24% by weight, developability with an aqueous developer is lowered. Therefore, the above range of the amount of the hydrophobic polymer (B) in the composition is preferred.

As the non-gaseous ethylenic unsaturated compound, a compound having one or more radical polymerizable ethylene groups in the molecule described hereinafter can be used alone or in combination two or more of them.

Examples of the non-gaseous ethylenic unsaturated compound include compounds having one radical polymerizable ethylene group in their molecules such as styrene, vinyltoluene, chlorostyrene, t-butylstyrene, a-methylstyrene, acrylonitrile, acrylic acid, methacrylic acid, methyl (meth)acrylate, ethyl (meth)acrylate, n-propyl (meth)acrylate, iso-propyl (meth)acrylate, n-butyl (meth) acrylate, iso-butyl (meth)acrylate, sec-butyl (meth)acrylate, t-butyl (meth)acrylate, 2-ethylhexyl (meth)acrylate, n-decyl (meth)acrylate, lauryl (meth)acrylate, n-dodecyl (meth) acrylate, stearyl (meth)acrylate, ethylene glycol mono(meth) acrylate, propylene glycol mono(meth)acrylate, diethylene glycol mono(meth)acrylate, dipropylene glycol mono(meth) acrylate, polyethylene glycol mono(meth)acrylate, polypropylene glycol mono(meth)acrylate, polyethylene glycol monomethyl ether mono(meth)acrylate, polypropylene glycol monomethyl ether mono(meth)acrylate, polyethylene glycol, monoethyl ether mono(meth)acrylate, polypropylene glycol monoethyl ether mono (meth) acrylate, n-butoxyethyl (meth) acrylate, phenoxyethyl (meth)acrylate, 2-phenoxypropyl (meth)acrylate, cyclohexyl (meth) acrylate, tetrahydrofurfuryl (meth)acrylate, glycidyl (meth) acrylate, allyl (meth)acrylate, benzyl (meth)acrylate, tribromophenyl (meth)acrylate, 2,3 -dichloropropyl (meth) acrylate, 3-chloro-2-hydroxypropyl (meth)acrylate, N,N-diethylaminoethyl (meth)acrylate, N,N-dimethylaminoethyl (meth)acrylate, N-t-butylaminoethyl (meth)acrylate, acrylamide, N,N-dimethylacrylamide, and N,N-diethylacrylamide, among others.

In addition, there can be mentioned compounds having two or more radical polymerizable ethylene groups in their molecules such as ethylene glycol di(meth)acrylate, diethylene glycol di(meth)acrylate, polyethylene glycol di(meth) acrylate, propylene glycol di(meth)acrylate, dipropylene glycol di(meth)acrylate, polypropylene glycol di(meth) acrylate, 1,3-butylene glycol di(meth)acrylate, 1,4-butanediol di(meth)acrylate, neopentyl glycol di(meth) acrylate, 1,6-heexyanediol di(meth)acrylate, 1,9-nonanediol di(meth)acrylate, 1,10-decanediol di (meth) acrylate, 1,12-dodecane di (meth) acrylate, 1,14-tetradecanediol di(meth) acrylate, pentaerythritol di(meth)acrylate, pentaerythritol tri (meth)acrylate, pentaerythritol tetra(meth)acrylate, glycerol di(meth)acrylate, glycerol allyloxy di(meth)acrylate, trimethylolethane di(meth)acrylate, trimethylolethane tri(meth) acrylate, trimethylolpropane di(meth)acrylate, trimethylolpropane tri(meth)acrylate, dicyclopentyl dimethylene diacrylate, triallyl cyanurate, triallyl isocyanurate, triallyl trimellitate, diallyl terephthalate, diallyl phthalate, divinyl benzene, polyurethane (meth)acrylate, polyester (meth) acrylate, oligobutadiene (meth)acrylate, oligoisoprene (meth)acrylate, and oligopropylene (meth)acrylate, among others.

In particular, the preferred non-gaseous ethylenic unsaturated compounds are 1,6-hexanediol di(meth)acrylate, 1,9-nonanediol di(meth)acrylate, 1,10-decanediol di(meth) acrylate, 1,12-dodecanediol di(meth)acrylate, 1,14-tetradecanediol di(meth)acrylate, trimethylolpropane tri (meth)acrylate, dicyclopentyl dimethylene diacrylate, oligobutadiene (meth)acrylate and oligoisoprene (meth) acrylate.

The non-gaseous ethylenic unsaturated compound is compounded in an amount of 1 to 50%, preferably 5 to 40% by weight based on the total weight of the resin composition. When the amount of the non-gaseous ethylenic unsaturated compound is less than 1% by weight, the photosensitive resin composition is cured insufficiently upon irradiation of actuating light and no image appears upon developing. On the other hand, when the amount exceeds 50% by weight, shape retention of the resultant photosensitive resin original sheet is lowered and the resultant printing matrix becomes hard and fragile. This is undesirable for a photosensitive resin composition for flexographic printing.

It is preferred to use the non-gaseous ethylenic unsaturated compound having close SP value to that of the hydrophobic polymer (B) so that it is immiscible with the hydrophobic polymer (A) but miscible with the hydrophobic polymer (B). Preferably, SP value of the non-gaseous ethylenic unsaturated compound is within the range from 7.8 to <8.8.

In the photosensitive resin composition of the present invention, it is of importance to control miscibility of compounding components one another so as to provide the desired phase-separated structure of the core phase, the shell phase and the matrix phase, and further to make the difference between the refractive index of the core phase and that of the matrix phase smaller.

By using materials immiscible with one another as the hydrophobic polymer (A) which is the main component of the core phase, the hydrophilic polymer which is the main component of the shell phase, and the hydrophobic polymer (B) and the non-gaseous ethylenic unsaturated compound which are the main components of the matrix phase, the desired phase-separated structure in which particles of the hydrophobic nuclei (core phase) and the hydrophilic phase (shell phase) covering about the nuclei are dispersed in the matrix phase can be obtained, and developability with water can be compatible with aqueous ink resistance. In addition, by using materials well miscible with each other as the hydrophobic polymer (B) and the non-gaseous ethylenic unsaturated compound, the resin composition with less light scattering and having improved mechanical properties can be obtained.

Furthermore, by making the difference between the refractive index of the hydrophobic polymer (A) which is the main component of the core phase and that of the mixture of the hydrophobic polymer (B) and the non-gaseous ethylenic unsaturated compound which are the main components of the matrix phase smaller, irradiated actuating light goes straight through the resin without scattering. In particular, when the difference in the refractive indexes is 0.010 or less, and when this photosensitive resin composition is used as a printing original sheet, a minute or fine image can be reproduced in a relief upon developing and the range of proper light exposure time (light exposure latitude) becomes wider. Thus, it is possible to solve both problems that an imaged part of a relief obtained by developing is thicker than the image of a negative film and that the depth of a non-imaged part is smaller. Further, as a result, it is possible to minimize such problems that an image of printed matter becomes thicker than its original image, dot parts darken, and printing quality is deteriorated by adhering too much ink to a non-imaged part.

Examples of the photopolymerization initiator to be used in the present invention include benzophenones, benzoins, acetophenones, benzils, benzoin alkyl ethers, benzil alkyl ketals, anthraquinones, thioxanthones, and the like. Specific examples thereof are benzophenone, chlorobenzophenone, benzoin, acetophenone, benzil, benzoin methyl ether, benzoin ethyl ether, benzoin propyl ether, benzoin butyl ether, benzil dimethyl ketal, benzil diethyl ketal, benzil diisopropyl ketal, anthraquinone, 2-chloroanthraquinone, thioxanthone, and 2-chlorothioxanthone. The photopolymerization initiator is compounded in an amount of 0.01 to 5%, preferably 0.1 to 3% by weight based on the total weight of the resin composition. When the amount of the photopolymerization initiator compounded in the resin composition is less than 0.01% by weight, the photosensitive resin composition is cured insufficiently upon irradiation of actuating light. On the other hand, when the amount exceeds 5% by weight, the desired depth of curing cannot be obtained because of own shading. Then, in either case, an image is hard to remain after developing and this is undesired.

In the photosensitive resin composition of the present invention, a heat polymerization inhibiting agent may be added so as to inhibit heat polymerization without inhibiting the photopolymerization reaction. Examples of the useful heat polymerization inhibiting agent include hydroquinone, hydroquinone monomethyl ether, catechol, p-t-butylcatechol, and 2,6-di-t-butyl-p-cresol, among others.

Preferably, the above photopolymerization initiator and the heat polymerization inhibiting agent are uniformly distributed throughout the photosensitive resin composition.

In the present invention, desirably, the dispersed particles composed of the core phase and the shell phase have an average particle size within the range of 0.01 to 20 μm, preferably 0.01 to 15 μm, more preferably 0.05 to 10 μm. When the average particle size of the dispersed particles is less than 0.01 μm, developability of the resultant photosensitive resin original sheet with an aqueous developer is lowered. On the other hand, when the average particle size exceeds 20 μm, a minute or fine image is apt to be broken during development. Therefore, the average particle size of the dispersed particles within the above range is preferred.

The photosensitive resin composition having the above-described phase-separated structure of the present invention can be produced by mixing and kneading the hydrophobic polymer (A), the hydrophobic polymer (B), the hydrophilic polymer, the non-gaseous ethylenic unsaturated compound, the photopolymerization initiator, and, if necessary, the heat polymerization inhibiting agent and the like with a kneader, an extruder or the like, according to a per se known method. Further, a photosensitive resin original printing sheet can be produced by using the resultant photosensitive resin composition, according to a per se known method, preferably, by laminating an adhesive layer, a photosensitive resin layer of the composition, an anti-tack layer and a cover film on a base in this order.

Specifically, for example, the photosensitive resin printing original sheet having the desired thickness and width can be obtained by placing the photosensitive resin layer between the base having the adhesive layer coated thereon and the cover film having the anti-tack layer coated thereon, and subjecting the resultant laminated material to hot pressing, calendering or the like.

More specifically, for example, the given amounts of the hydrophilic polymer having —COOM group (Mis alkali metal ion and/or alkaline earth metal ion), nitrile-butadiene rubber as the hydrophobic polymer (A), butadiene rubber as the hydrophobic polymer (B), and oligobudadiene acrylated as the non-gaseous ethylenic unsaturated compound together with the photopolymerization initiator and the like are mixed and kneaded in toluene and water at 90 to 110° C. and then the solvent is distilled off to obtain the photosensitive resin composition having the core phase, the shell phase and the matrix phase of the present invention.

Then, the resultant photosensitive resin composition is placed between a base (polyethylene terephthalate film) and a cover film to obtain the photosensitive resin printing original sheet.

The photosensitive resin composition of the present invention can be cured by irradiation of UV light having wavelength of 150 to 500 nm, in particular, 300 to 400 nm. Its light source is, preferably, low pressure mercury vapor lamp, high pressure mercury vapor lamp, ultra-high pressure mercury vapor lamp, metal halide lamp, xenon lamp, zirconium lamp, carbon arc lamp, fluorescent lighting for UV, or the like.

In the photosensitive resin composition of the present invention, its uncured part can be removed with a developer obtained by adding a surfactant to water. As the surfactant, any of anionic surfactants, cationic surfactants, nonionic surfactants and ampholytic surfactants can be used alone or in combination of two or more of them. Further, if necessary, other additives can be added to the developer. Examples of additives include acidic or alkaline inorganic or organic salts such as sodium carbonate, sodium tripolyphosphate, sodium pyrophosphate, sodium silicate, sodium sulfate, sodium borate, sodium acetate, magnesium acetate, sodium citrate, sodium succinate, etc.; high molecular weight additives such as carboxymethylcellulose, methylcellulose, etc.; pH adjusting agents such as acids, for example, sulfuric acid, hydrochloric acid, phosphoric acid, etc., and alkalis such as sodium hydroxide, potassium hydroxide, calcium hydroxide, etc.; and other additives such as viscosity modifier, dispersion stabilizer, flocculating agent, zeolite, and the like.

For developing, the photosensitive resin composition is dipped in a developer and, if necessary, rubbed off an uncured part with a brush. Preferably, the developer is at 30 to 50° C.

A photosensitive resin printing matrix can be obtained from the above-described photosensitive resin original sheet obtained by using the photosensitive resin composition of the present invention by bringing a negative film of the image to be printed into contact with the original sheet, subjected to light exposure by irradiating UV light under the above-described light source to form the image and then developing the sheet with an aqueous developer to remove a non-light exposure uncured part.

The photosensitive resin printing matrix thus obtained has rubber resilience and useful for flexographic printing. Further, it has improved ink resistance.

In addition to flexographic printing, the photosensitive resin composition of the present invention can be used for photoresist, and can be used as an elastomer curable by irradiating UV light.

The present invention will be further illustrated by the following Reference Examples, Examples and Comparative Examples; however, the present invention is not limited to them. In the following Reference Examples, Examples and Comparative Examples, all the "parts" are by weight.

REFERENCE EXAMPLE 1

Preparation of hydrophilic polymer

Hexamethylene diisocyanate (119.0 parts, manufactured by Nippon Polyurethane Industry Co., Ltd.), dimethylol propionic acid (62.0 parts, manufactured by Fujii Yoshimichi Co.), polytetramethylene glycol (29.0 parts, G-850 manufactured by Hodogaya Chemical Co., Ltd.) and dibutyltin dilaurate (5.0 parts) were dissolved in tetrahydrofuran (300 parts) and this solution was placed in a 1-liter flask equipped with a stirrer. The solution was allowed to react with stirring and heating at 65° C. for 2 hours. Separately, acrylonitrile-butadiene oligomer having a terminal amino group (184.0 parts, Hycar ATBN 1300×16, Ube Industries, Ltd.) was dissolved in tetrahydrofuran (270 parts) in a different container. The later solution was added to the above solution in the 1-liter flask with stirring at room temperature. Tetrahydrofuran was distilled off from the polymer solution under reduced pressure and the polymer solution was dried under reduced pressure to obtain a polymer having the number-average molecular weight of 6,700. Then, the polymer (100 parts) was dissolved in methyl ethyl ketone (100 parts) and to this was added a solution of lithium hydroxide (4.8 parts) in methanol (100 parts) with stirring at room temperature. Stirring was continued for additional 30 minutes to obtain the desired hydrophilic polymer.

EXAMPLE 1

The hydrophilic polymer obtained in the above Reference Example 1 (12 parts), nitrile-butadiene rubber (acrylonitrile 35%, 42 parts, JSR N230SH manufactured by Japan Synthetic Rubber Co., Ltd.) as the hydrophobic polymer (A), butadiene rubber (15 parts, JSR BR02L manufactured by Japan Synthetic Rubber Co., Ltd.) as the hydrophobic polymer (B), oligobutadiene acrylate (29 parts, PB-A manufactured by Kyoeisha Chemical Co., Ltd.) as the non-gaseous ethylenic unsaturated compound, benzil dimethyl ketal (1 part) as the photopolymerization initiator, and hydroquinone monomethyl ether (0.5 part) as the heat polymerization inhibiting agent were mixed and kneaded together with water (10 parts) and toluene (40 parts) in a heating kneader at 105° C. Then, toluene and water were distilled off to obtain the desired photosensitive resin composition.

The resultant photosensitive resin composition was placed between a polyethylene terephthalate film having the thickness of 125 $\mu$m and having a polyester adhesive layer coating thereon, and the same polyethylene terephthalate film having an anti-tack layer coating (containing polyvinyl alcohol, propylene glycol and surfactant) thereon so that the adhesive layer and the anti-tack layer faced each surface of the photosensitive resin composition. Then, the resultant laminate was subjected to hot pressing with a hot press at 105° C. under the pressure of 100 kg/cm$^2$ for 1 minute to obtain a photosensitive resin original sheet having the thickness of 2.8 mm.

EXAMPLE 2

According to the same manner as described in Example 1, a photosensitive resin original sheet was prepared except that, in addition to oligobutadiene acrylate, trimethylolpropane trimethacrylate (10 parts) was further added as the non-gaseous ethylenic unsaturated compound.

EXAMPLE 3

According to the same manner as described in Example 2, a photosensitive resin original sheet was prepared except that 1,9-nonanediol dimethacrylate was used instead of trimethylolpropane trimethacrylate.

EXAMPLE 4

According to the same manner as described in Example 2, a photosensitive resin original sheet was prepared except that dicyclopentyl dimethylene diacrylate (Kayarad R-684, manufactured by Nippon Kayaku Co., Ltd.) was used instead of trimethylolpropane trimethacrylate.

EXAMPLE 5

According to the same manner as described in Example 1, a photosensitive resin original sheet was prepared except that isoprene rubber (JSR IR10 manufactured by Japan Synthetic Rubber Co., Ltd.) was used instead of butadiene rubber.

EXAMPLE 6

According to the same manner as described in Example 4, a photosensitive resin original sheet was prepared except that chlorinated polyethylene (DaisolacH-135manufactured by Daiso Co., Ltd.) was used instead of nitrile-butadiene rubber.

COMPARATIVE EXAMPLE 1

According to the same manner as described in Example 1, a photosensitive resin original sheet was prepared except that styrene-butadiene rubber (styrene 23.5%, JSR 1507 manufactured by Japan Synthetic Rubber Co., Ltd.) was used instead of butadiene rubber.

COMPARATIVE EXAMPLE 2

According to the same manner as described in Example 1, a photosensitive resin original sheet was prepared except that chlorinated polyethylene (Daisolac H-135 manufactured by Daiso Co., Ltd.) was used instead of nitrile-butadiene rubber.

COMPARATIVE EXAMPLE 3

According to the same manner as described in Example 1, a photosensitive resin original sheet was prepared except that chlorinated polyethylene (Daisolac H-135 manufactured by Daiso Co., Ltd.) was used instead of nitrile-butadiene rubber and styrene-butadiene rubber (styrene 23.5%, JSR 1507 manufactured by Japan Synthetic Rubber Co., Ltd.) was used instead of butadiene rubber.

REFERENCE EXAMPLE 2

The refractive indexes of the hydrophobic polymers (A), and the refractive indexes of the mixtures of the hydrophobic polymers (B) and the non-gaseous ethylenic unsaturated compounds in the photosensitive resin compositions obtained in the above Examples 1 to 6 and Comparative Examples 1 to 3, as well as the light scattering rates of the photosensitive resin compositions, light exposure latitudes of the resultant photosensitive resin original sheets and evaluation of the printed matter obtained by using the resultant photosensitive resin printed matrices were determined according to the following methods.

The results are shown in Tables 1A and 1B.

Determination of refractive index

The refractive index was measured by using Abbe's refractometer according to the method of JIS K0062. In case of the mixture of the hydrophobic polymer (B) and the non-gaseous ethylenic unsaturated compound, they were mixed with a kneader.

Determination of light scattering rates

The photosensitive resin composition was placed between two polyethylene terephthalate films each having the thickness of 125 $\mu$m (no coating) and the resultant laminate was heated and pressed with a hot press at 105° C. under pressure of 100 kg/cm$^2$ to obtain a laminate having the thickness of 0.2 mm. The light scattering rate of the photosensitive resin composition was determined at $\lambda$=365 nm with a spectrophotometer (U-3210 manufactured by Hitachi, Ltd., equipped with 150$\phi$ integrating sphere attachment).

Evaluation of light scattering latitude

Regarding the photosensitive resin original sheet, the polyethylene terephthalate film on the anti-tack layer coating was released. A negative film having an image (non-imaged part of 300 μm wide and 1501 pi 3% and 30% dot part) was brought into contact thereon and the sheet was subjected to light exposure with a high pressure mercury vapor lamp (manufactured by Dainippon Screen Mfg. Co., Ltd.) at luminous intensity of 25 W/cm². After removing the negative film, the sheet was dipped in an aqueous developer containing sodium butylnaphthalene sulfonate (2 parts, Pelex NB-L manufactured by Kao Corporation) at 40° C. and the photosensitive resin layer was rubbed with brush for 15 minutes to obtain a photosensitive resin printing matrix. The depth of the non imaged part having the width of 300 μm of the resultant printing matrix was measured with a projector (PROFILE PROJECTOR V-10 manufactured by Nikon Corporation). The light exposure latitude was evaluated based on light exposure time required for reproduction of the dot part of 1501 pi 3% on the relief, and that required for bringing the depth of the non-imaged part to 50 pm or more.

Evaluation of printed matter

Regarding the resultant photosensitive resin printing matrix (light exposure time: 5minutes under the above high pressure mercury vapor lamp), printing on coated paper (Ryuo Coat manufactured by Daishowa Paper Industry Co., Ltd.) with an aqueous ink (Aquapack 39 indigo manufactured by Toyo Ink Manufacturing Co., Ltd.). Reproducibility of the non-imaged part having the width of 300 μm of the resultant printing matrix was evaluated according to the following three-grading criteria.

A: No ink is adhered to the non-imaged part.
B: Some ink is adhered to the non-imaged part.
C: A considerable amount of ink is adhered to the non-imaged part.

In addition, the optical density of the dot part of 1501 pi 30% was determined with a reflection densitometer (DM-800 manufactured by Dainippon Screen Mfg. Co., Ltd.). Smaller optical density is more preferred because printed matter having smaller dot gain and higher brightness can be obtained.

TABLE 1A

| | Refractive Index | | | |
|---|---|---|---|---|
| Ex. No. | Hydrophobic polymer (A) | Mixture of hydrophobic polymer (B) and non-gaseous ethylenic unsaturated compound | Difference between refractive indexes | Light scattering rate (%) |
| Ex. 1 | 1.521 | 1.524 | 0.003 | 23 |
| Ex. 2 | 1.521 | 1.516 | 0.005 | 36 |
| Ex. 3 | 1.521 | 1.516 | 0.005 | 34 |
| Ex. 4 | 1.521 | 1.519 | 0.002 | 15 |
| Ex. 5 | 1.521 | 1.524 | 0.003 | 27 |
| Ex. 6 | 1.510 | 1.519 | 0.009 | 45 |
| Comp. Ex. 1 | 1.521 | 1.533 | 0.012 | 60 |
| Comp. Ex. 2 | 1.510 | 1.524 | 0.014 | 79 |
| Comp. Ex. 3 | 1.510 | 1.533 | 0.023 | 86 |

TABLE 1B

| | Light exposure latitude | | | Evaluation of printed matter | |
|---|---|---|---|---|---|
| Ex. No. | Light exposure time (min.) required for reproduction of 1501 pi 3% dot part | Light exposure time (min.) required for obtaining 300 μm non-imaged part having 50 μm or more depth | Light exposure latitude (min.) | Reproducibility of 300 μm non-imaged part | Optical density of 1501 pi 30% dot part (%) |
| Ex. 1 | >5 | <12 | 7 | A | 62 |
| Ex. 2 | >4 | <11 | 7 | A | 63 |
| Ex. 3 | >4 | <11 | 7 | A | 63 |
| Ex. 4 | >4 | <12 | 8 | A | 59 |
| Ex. 5 | >5 | <12 | 7 | A | 62 |
| Ex. 6 | >4 | <8 | 4 | A | 63 |
| Comp. Ex. 1 | >5 | <5 | 0 | B | 78 |
| Comp. Ex. 2 | >5 | <5 | 0 | B | 80 |
| Comp. Ex. 3 | >5 | <4 | 0 | C | 88 |

As is seen from Tables 1A and 1B, regarding the photosensitive resin original sheets obtained in Examples 1 to 6, light scattering in the resin is decreased because the difference between the refractive index of the hydrophobic polymer (A) which is the main component of the core phase, and that of the mixture of the hydrophobic polymer (B) and the non-gaseous ethylenic unsaturated compound is within the desired range. As a result, light exposure latitude becomes wider. In addition, it is clear that ink is hardly adhered to the non-imaged part upon printing and dot gain of the resultant printed matter is decreased. On the other hand, regarding the photosensitive resin original sheets obtained in Comparative Examples 1 to 3, since the difference in refractive indexes is outside of the desired range, light scattering in the resin is increased. As a result, light exposure latitude becomes narrower. In addition, it is clear that ink is apt to be adhered to the non-imaged part upon printing and dot gain of the resultant printed matter is increased.

As described hereinabove, when the photosensitive resin composition is as a photosensitive resin original sheet, light scattering of irradiated actuating light in the resin is decreased. As a result, wider light exposure latitude can be obtained. In addition, clear printed matter having improved printing reproducibility can be obtained.

What is claimed is:

1. A photosensitive resin composition which comprises:
   (1) a core phase consisting essentially of a non-crosslinkable hydrophobic polymer (A) having a glass transition temperature at 5° C. or lower;
   (2) a shell phase consisting essentially of a hydrophilic polymer, which covers said core phase to form dispersed particles;
   (3) a matrix phase consisting essentially of a mixture of a hydrophobic polymer (B) which is immiscible with the hydrophobic polymer (A) and a non gaseous ethylenic unsaturated compound; and
   (4) a photopolymerization initiator, and the difference between refractive index of said hydrophobic polymer (A) of said core phase (1) and that of said mixture of said hydrophobic polymer (B) and said ethylenic unsaturated compound of said matrix phase (3) being 0.010 or less.

2. A photosensitive resin composition according to claim 1, wherein the hydrophobic polymer (A) is present in an amount of 10 to 60% by weight based on the total weight of the composition.

3. A photosensitive resin composition according to claim 1, wherein the hydrophilic polymer is present in an amount of 1 to 50% by weight based on the total weight of the composition.

4. A photosensitive resin composition according to claim 1, wherein the hydrophobic polymer (B) is present in an amount of 1 to 24% by weight based on the total weight of the composition.

5. A photosensitive resin composition according to claim 1, wherein the solubility parameter of the hydrophobic polymer (A) is within a range of 8.8 to 9.8 and the solubility parameter of the hydrophobic polymer (B) is within a range of 7.8 to <8.8.

6. A photosensitive resin composition according to claim 1, wherein the non-gaseous ethylenic unsaturated compound is present in an amount of 1 to 50% by weight based on the total weight of the composition.

7. A photosensitive resin composition according to claim 1, wherein the solubility parameter of the non-gaseous ethylenic unsaturated compound is within a range of 7.8 to <8.8.

8. A photosensitive resin composition according to claim 1, wherein the photopolymerization initiator is present in an amount of 0.01 to 5% by weight based on the total weight of the composition.

9. A photosensitive resin composition according to claim 1, wherein the average particle size of the dispersed particles is within a range of 0.01 to 20 μm.

10. A photosensitive resin composition according to claim 1, wherein the composition further comprises a heat polymerization inhibiting agent.

11. A photosensitive resin composition which comprises:

(1) a core phase comprising a non-crosslinkable hydrophobic polymer (A) having a glass transition temperature at 5° C. or lower;

(2) a shell phase comprising a hydrophilic polymer, which covers said core phase to form disposed particles;

(3) a matrix phase comprising a mixture of a hydrophobic polymer (B) which is immiscible with the hydrophobic polymer (A) and a non gaseous ethylenic unsaturated compound; and (4) a photopolymerization initiator, and the difference between refractive index of said hydrophobic polymer (A) of said core phase (1) and that of said mixture of said hydrophobic polymer (B) and said ethylenic unsaturated compound of said matrix phase (3) being 0.010 or less.

12. A photosensitive resin composition according to claim 11, wherein the hydrophobic polymer (A) is present in an amount of 10 to 60% by weight based on the total weight of the composition.

13. A photosensitive resin composition according to claim 11, wherein the hydrophilic polymer is present in an amount of 1 to 50% by weight based on the total weight of the composition.

14. A photosensitive resin composition according to claim 11, wherein the hydrophobic polymer (B) is present in an amount of 1 to 24% by weight based on the total weight of the composition.

15. A photosensitive resin composition according to claim 11, wherein the solubility parameter of the hydrophobic polymer (A) is within a range of 8.8 to 9.8 and the solubility parameter of the hydrophobic polymer (B) is within a range of 7.8 to <8.8.

16. A photosensitive resin composition according to claim 11, wherein the solubility parameter of the non-gaseous ethylenic unsaturated compound is present in an amount of 1 to 50% by weight based on the total weight of the composition.

17. A photosensitive resin composition according to claim 11, wherein the solubility parameter of the non-gaseous ethylenic unsaturated compound is within a range of 7.8 to <8.8.

18. A photosensitive resin composition according to claim 11, wherein the photopolymerization initiator is present in an amount of 0.01 to 5% by weight based on the total weight of the composition.

19. A photosensitive resin composition according to claim 11, wherein the average particle size of the dispersed particles is within a range of 0.01 to 20 μm.

20. A photosensitive resin composition according to claim 11, wherein the composition further comprises a heat polymerization inhibiting agent.

* * * * *